United States Patent [19]
Lee

[11] Patent Number: 5,881,128
[45] Date of Patent: Mar. 9, 1999

[54] TECHNIQUE FOR PREVENTING DATA STORED IN A MEMORY OF TELEPHONE SYSTEM FROM BEING CORRUPTED DURING POWER FAILURE

[75] Inventor: Hyung-Gon Lee, Daegu, Rep. of Korea

[73] Assignee: SamSung Electronics Co., Ltd., Suwon, Rep. of Korea

[21] Appl. No.: 797,359

[22] Filed: Feb. 12, 1997

[30] Foreign Application Priority Data

Feb. 12, 1996 [KR] Rep. of Korea ..................... 1996-3315

[51] Int. Cl.⁶ .............................. H04M 1/24; H04M 3/08; H04M 3/22
[52] U.S. Cl. .................................. 379/1; 379/413; 379/2; 379/27; 379/32; 455/572; 455/343
[58] Field of Search ................................. 379/1, 2, 8, 10, 379/26, 27, 33, 34, 85, 130, 169, 176, 186, 307, 317, 322, 324, 413, 399, 379, 165; 455/574, 572, 343; 370/242; 395/651, 750.08, 750.03

[56] References Cited

U.S. PATENT DOCUMENTS

| | | | |
|---|---|---|---|
| 4,197,432 | 4/1980 | Tiedt . | |
| 4,457,021 | 6/1984 | Belisomi | 455/186 |
| 4,488,006 | 12/1984 | Essig et al. . | |
| 4,509,201 | 4/1985 | Sekigawa et al. | 455/73 |
| 4,653,088 | 3/1987 | Budd et al. . | |
| 4,779,091 | 10/1988 | Oyagi et al. | 455/343 |
| 4,893,348 | 1/1990 | Andoh | 455/572 |
| 4,942,604 | 7/1990 | Smith et al. | 379/412 |
| 4,961,220 | 10/1990 | Tentler et al. . | |
| 4,982,443 | 1/1991 | Komoda | 455/343 |
| 5,014,308 | 5/1991 | Fox . | |
| 5,042,066 | 8/1991 | Ikefuji . | |
| 5,182,769 | 1/1993 | Yamaguchi et al. . | |
| 5,241,591 | 8/1993 | Saji . | |
| 5,327,172 | 7/1994 | Tan et al. | 455/343 |
| 5,349,697 | 9/1994 | Pelkonen | 455/89 |
| 5,353,330 | 10/1994 | Fujiwara | 455/13.4 |
| 5,418,841 | 5/1995 | Haraguchi et al. . | |
| 5,425,079 | 6/1995 | Noda et al. | 379/68 |
| 5,426,690 | 6/1995 | Hikuma et al. | 455/572 |
| 5,438,695 | 8/1995 | Morimura et al. | 455/572 |
| 5,551,077 | 8/1996 | Oda | 455/572 |
| 5,581,612 | 12/1996 | Nishikawa | 379/156 |
| 5,715,523 | 2/1998 | Reynolds | 455/89 |
| 5,729,589 | 3/1998 | Samson | 455/572 |

*Primary Examiner*—Curtis A. Kuntz
*Assistant Examiner*—Rexford N Barnie
*Attorney, Agent, or Firm*—Robert E. Bushnell, Esq.

[57] ABSTRACT

A circuit for preventing data stored in a memory of a telephone system from being corrupted including: a memory for receiving a plurality of control signals from the processor and for storing received data; a decoder connected to a chip enable terminal of the memory, for receiving a plurality of control signals from the processor and for generating a memory enable signal during a normal operation voltage range of the processor, and for placing the memory in an inactive state by supplying a disabling signal to the chip enable terminal of the memory during an abnormal operation voltage range of the processor; a voltage sensing circuit, connected to a chip enable terminal of the decoder, for generating a high level during the normal operation voltage range of the processor, and for generating a low level during the abnormal operation voltage range of the processor for controlling the decoder; and a battery power source supplier for supplying power to the memory and the decoder.

8 Claims, 2 Drawing Sheets

Fig. 1 *(Related Art)*

TECHNIQUE FOR PREVENTING DATA STORED IN A MEMORY OF TELEPHONE SYSTEM FROM BEING CORRUPTED DURING POWER FAILURE

CLAIM OF PRIORITY

This application makes reference to, incorporates the same herein, and claims all benefits accruing under 35 U.S.C. §119 from an application entitled *Technique for Preventing Data Stored in a Memory of Telephone System from Being Corrupted During Power Failure* earlier filed in the Korean Industrial Property Office on 12 Feb. 1996, and there duly assigned Serial No. 3315/1996 by that Office.

BACKGROUND OF THE INVENTION

1. Field of the Invention

The present invention relates to telephone systems and, more particularly, to a technique for preventing data stored in a memory of a telephone system from being corrupted during a power failure.

2. Description of the Related Art

In a telephone system, important data which must be stored in a memory even during a power failure is generally backed up by a battery. As a memory, a SRAM (static random access memory) which is easily available in the market is widely used.

In an earlier circuit for storing data of a memory of a telephone system during a power failure, the memory receives an address, data, a read signal and a write signal from a processor. A chip enable terminal of the memory is connected to an output terminal of an OR gate. The OR gate has one terminal connected to a memory enable signal and has another terminal connected through an inverter to an output of a voltage sensing circuit. A decoder receives signals from the processor and generates the memory enable signal. In order to store important data even during a power failure, a power source is applied through an external battery to the inverter and to the OR gate and the decoder. During the power failure, the data stored in the memory as prevented for being overwritten and corrupted by disabling the chip enable terminal of the memory in response the output of the voltage sensing circuit.

The following patents each disclose features in common with the present invention but do not teach or suggest a circuit for preventing data stored in the memory for being corrupted which includes a decoder connected to a chip enable terminal of the memory and includes a voltage sensing circuit connected to a chip enable terminal of the decoder from disabling the memory during an abnormal operation voltage range as recited in the present claims.

| PATENT NO. | INVENTOR | DATE |
| --- | --- | --- |
| 5,418,841 | Haraguchi et al. | May 23, 1993 |
| 5,241,591 | Saji | August 31, 1993 |
| 5,182,769 | Yamaguchi et al. | January 26, 1993 |
| 5,042,066 | Ikefuji | August 20, 1991 |
| 5,014,308 | Fox | May 7, 1991 |
| 4,961,220 | Tentler et al. | October 2, 1990 |
| 4,653,088 | Budd et al. | March 24, 1987 |
| 4,509,201 | Sekigawa et al. | April 2, 1985 |
| 4,488,006 | Essig et al. | December 11, 1984 |
| 4,197,432 | Tiedt | April 8, 1980 |

However, since the external battery supplies power to many logic circuits even during the power failure, the current consumed is increased and the capacity of the battery is increased in proportion thereto, thereby raising production costs. Furthermore, an operation time is increased due to the operation of the inverter and the OR gate and the circuit becomes complicated.

SUMMARY OF THE INVENTION

Therefore, it is an object of the present invention to provide a data storage circuit having a simple circuit construction which can store data of a memory of a telephone system during a power failure.

It is another object of the present invention to provide a data storage circuit of a telephone system which performs a fast and stable operation during a power failure.

In accordance with one aspect of the present invention, a circuit for preventing data stored in a memory of a telephone system from being corrupted includes: a memory for receiving a plurality of control signals from a processor and for storing received data; a decoder, connected to a chip enable terminal of the memory, for receiving a plurality of control signals from the processor and for generating a memory enable signal during a normal operation voltage range of the processor, and for placing the memory in an inactive state by supplying a disabling signal to the chip enable terminal of the memory during an abnormal operation voltage range of the processor; a voltage sensing circuit, connected to a chip enable terminal of the decoder, for generating a high level during the normal operation voltage range of the processor, and for generating a low level during the abnormal operation voltage range of the processor for controlling the decoder; and a battery power source supplier for supplying power to the memory and the decoder.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT

Figure 1:
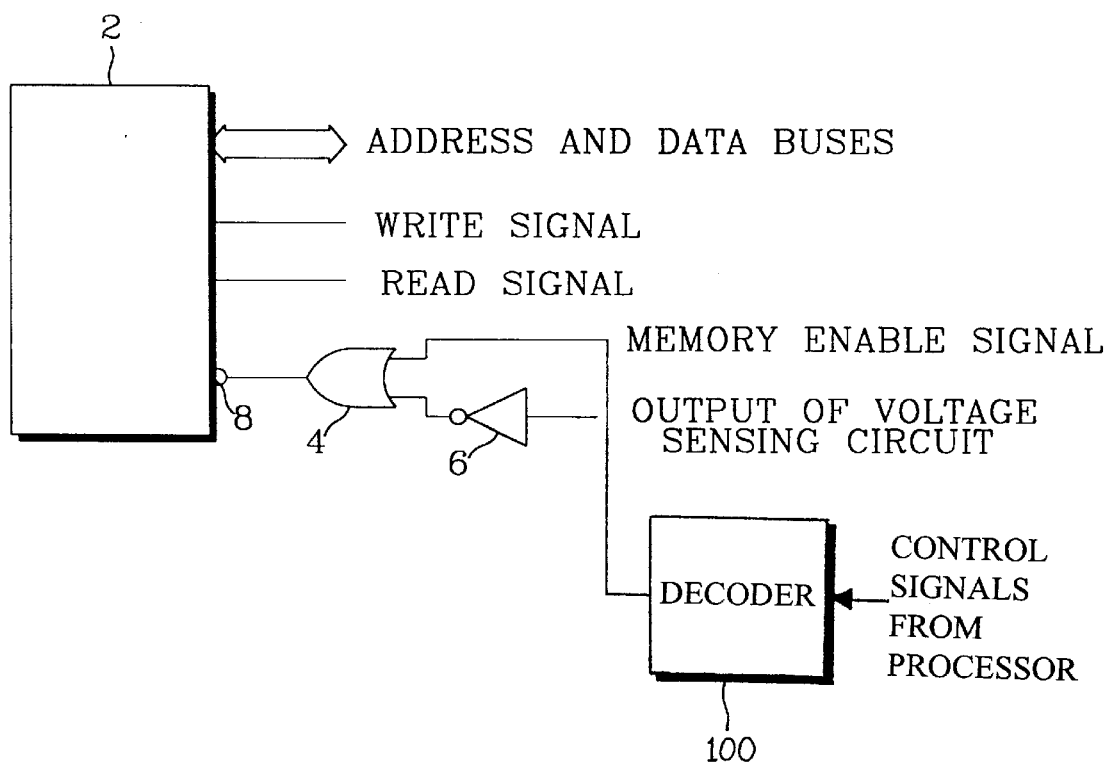
FIG. 1 illustrates an earlier circuit for storing data of a memory of a telephone system during a power failure.

FIG. 1, shows an earlier circuit for storing data of a memory of a telephone system during a power failure. A memory 2 receives an address, data, a read signal and a write signal from a processor. A chip enable terminal 8 of the memory 2 is connected to an output terminal of an OR gate 4. The OR gate 4 has one terminal connected to a memory enable signal and has another terminal connected through an inverter 6 to an output of a voltage sensing circuit. A decoder 100 receives signals from the processor and generates the memory enable signal. In order to store important data even during a power failure, a power source is supplied through an external battery to the inverter 6 and to the OR gate 4 and the decoder 100. During the power failure, the data stored in the memory is prevented from being overwritten and corrupted by disabling the chip enable terminal 8 in response to the output of the voltage sensing circuit.

Figure 2:
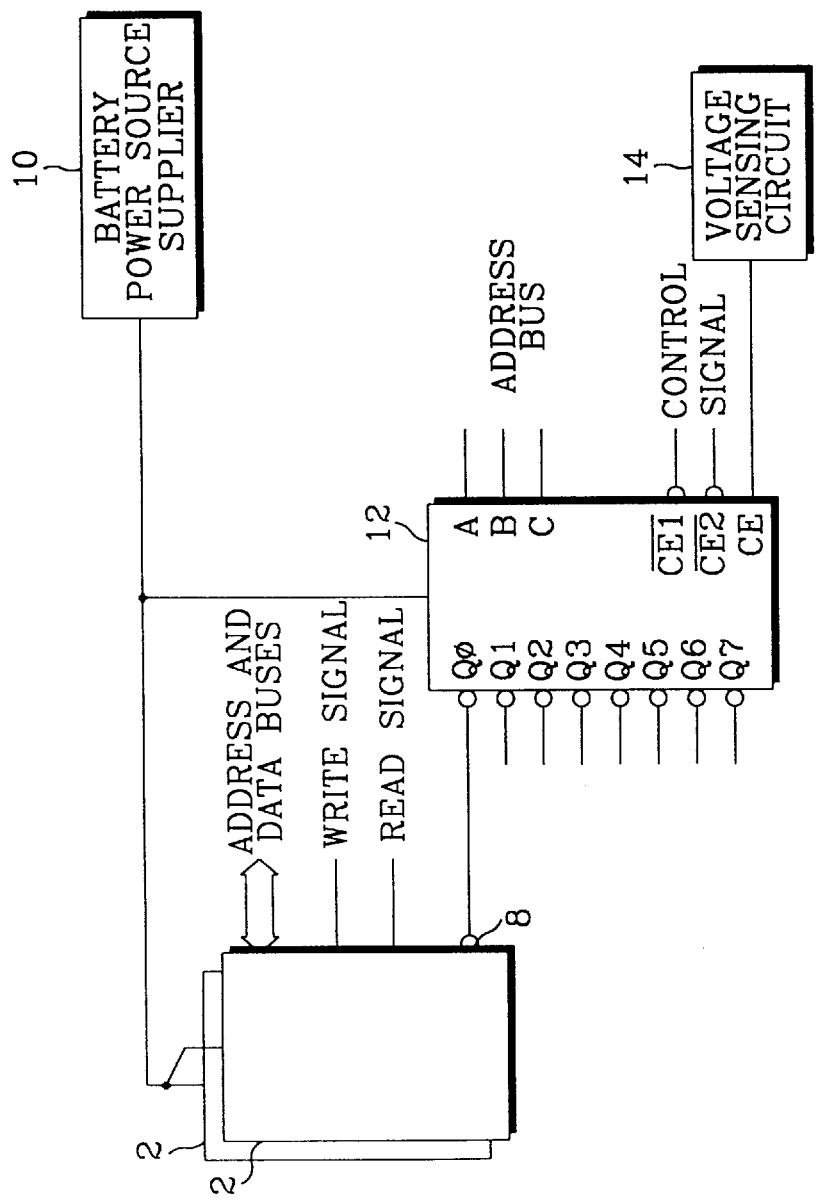
FIG. 2 illustrates a circuit for storing data of a memory of a telephone system during a power failure according to the present invention.

Referring to FIG. 2, a memory 2 receives a plurality of control signals from a processor and stores received data. A decoder 12, connected to a chip enable terminal 8 of the memory 2, receives a plurality of control signals from the processor. During a normal operation voltage range of the processor, the decoder 12 generates the control signals, and during an abnormal operation voltage is range of the processor, that is, during a power failure, the decoder 12 converts a write pin of the memory 2 into an inactive state or disables the chip enable terminal 8 of the memory 2. A voltage sensing circuit 14 connected to a chip enable terminal of the decoder 12 has an predetermined voltage range. The voltage sensing circuit 14 generates a high level during the normal operation voltage range of the processor and generates a low level during the abnormal operation voltage range of the processor. A battery power source supplier 10 supplies power to the memory 2 and the decoder 12.

The circuit shown in FIG. 2 has a simple construction since the decoder 12, controlled by the processor and the voltage sensing circuit 14, supplies a chip enable signal to the memory 2 together with a memory writing prevention signal. In particular, since an unnecessary signal, for example, a signal of the abnormal operation voltage range which may damage the data of the memory is prevented from being supplied to the memory, a stable operation is performed and the data stored in the memory is not corrupted.

The decoder 12 connects the chip enable terminal to an output terminal of the voltage sensing circuit 14. The decoder may comprise a 3-to-8 Line Decoder, Part No. MM74HC138, manufactured by the National Semiconductor Corporation. During the normal operation voltage range of the decoder, the decoder 12 is always enabled to the high level generated by the voltage sensing circuit 14 and decoded by the control and address signals. During the abnormal operation voltage range, the decoder 12 is disabled by the low level generated by the voltage sensing circuit 14, and an input signal of the chip enable terminal of the memory 2 is converted into the low level. Therefore, the data stored in the memory can be prevented from being corrupted.

Generally, the propagation delay time of the integrated circuit for the OR gate 4 and the inverter 6 of the earlier circuit of FIG. 1 is respectively about 20 nsec, and accordingly the present invention can prevent the operation time from being delayed for as much as 40 nsec in total.

Furthermore, the present invention has another advantage in that the electrical power supplied to the gate and inverter in FIG. 1 can be avoided, thereby receiving the power consumption. If the OR gate 4 and the inverter 6 are fabricated of CMOS circuitry, each consumes a power of about 5 $\mu$W, and accordingly, the present invention enables the power consumption to be reduced by as much as 10 $\mu$W in total.

In addition, since the OR gate 4 and the inverter 6 are removed, the manufacturing cost is reduced.

It should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A circuit for preventing data stored in a memory of a telephone system including a processor from being corrupted, comprising:

a memory for receiving a plurality of control signals from the processor and for storing received data;

a decoder, having an output connected to a chip enable terminal of said memory, for receiving a plurality of control signals from the processor and for generating memory enable signals during a normal operation voltage range of said processor, and for placing said memory in an inactive state by supplying a disabling signal to said chip enable terminal of said memory during an abnormal operation voltage range of said processor;

a voltage sensing circuit, having an output connected to a chip enable terminal of said decoder, for controlling said decoder by generating a high level during said normal operation voltage range of said processor and generating a low level during said abnormal operation voltage range of said processor, said voltage sensing circuit having a predetermined normal operation voltage range; and a battery power source supplier for supplying power to said memory and said decoder.

2. A circuit for preventing data stored in a memory of a telephone system from being corrupted as claimed in claim 1, said decoder being an MM74HC138 3-of-8 decoder chip.

3. A circuit for preventing data stored in a memory of a telephone system from being corrupted as claimed in claim 1, said predetermined voltage range being between a voltage during a normal operation of said processor when said power source is turned on and a voltage during the normal operation immediately before an abnormal operation of said processor when said power source is turned off.

4. A circuit for preventing data stored in a memory of a system including a processor from being corrupted, comprising:

a memory for receiving a plurality of control signals from the processor and for storing received data;

a decoder, having an output connected to a chip enable terminal of said memory, for receiving a plurality of control signals from the processor and for generating memory enable signals during a normal operation voltage range of said processor, and for placing said memory in an inactive state by supplying a disabling signal to said chip enable terminal of said memory during an abnormal operation voltage range of said processor;

a voltage sensing circuit, having an output connected to a chip enable terminal of said decoder, for controlling said decoder by generating a high level during said normal operation voltage range of said processor and generating a low level during said abnormal operation voltage range of said processor, said voltage sensing circuit having a predetermined normal operation voltage range; and a battery power source supplier for supplying power to said memory and said decoder.

5. A circuit for preventing data stored in a memory of a system from being corrupted as claimed in claim 4, said decoder being an MM74HC138 3-of-8 decoder chip.

6. A circuit for preventing data stored in a memory of a system from being corrupted as claimed in claim 4, said predetermined voltage range being between a voltage during a normal operation of said processor when said power source is turned on and a voltage during the normal operation immediately before an abnormal operation of said processor when said power source is turned off.

7. A method of preventing data stored in a memory of a system including a processor from being corrupted, comprising the steps of:

receiving a plurality of control signals from the processor and storing received data in a memory;

receiving a plurality of control signals from the processor in a decoder having an output connected to a chip enable terminal of said memory and generating memory enable signals during a normal operation voltage range of said processor, and placing said memory in an inactive state by supplying a disabling signal to said chip enable terminal of said memory during an abnormal operation voltage range of said processor;

controlling said decoder by generating a high level during said normal operation voltage range of said processor in a voltage sensing circuit having an output connected to a chip enable terminal of said decoder, and generating a low level during said abnormal operation voltage range of said processor, said voltage sensing circuit having a predetermined normal operation voltage range; and supplying power to said memory and said decoder with a battery power source supplier.

8. A method of preventing data stored in a memory of a telephone system from being corrupted as claimed in claim 7, said predetermined voltage range being between a voltage during a normal operation of said processor when said power source is turned on and a voltage during the normal operation immediately before an abnormal operation of said processor when said power source is turned off.

\* \* \* \* \*